US008907733B2

(12) United States Patent
Onishi et al.

(10) Patent No.: US 8,907,733 B2
(45) Date of Patent: Dec. 9, 2014

(54) OSCILLATOR

(75) Inventors: Yasuharu Onishi, Tokyo (JP); Jun Kuroda, Tokyo (JP); Motoyoshi Komoda, Tokyo (JP); Shigeo Satou, Tokyo (JP); Yukio Murata, Tokyo (JP); Yuichiro Kishinami, Tokyo (JP); Nobuhiro Kawashima, Tokyo (JP)

(73) Assignee: NEC Corporation, Tokyo (JP)

( * ) Notice: Subject to any disclaimer, the term of this patent is extended or adjusted under 35 U.S.C. 154(b) by 105 days.

(21) Appl. No.: 13/696,513

(22) PCT Filed: Jul. 7, 2011

(86) PCT No.: PCT/JP2011/003893
§ 371 (c)(1), (2), (4) Date: Nov. 6, 2012

(87) PCT Pub. No.: WO2012/011238
PCT Pub. Date: Jan. 26, 2012

(65) Prior Publication Data

US 2013/0049876 A1 Feb. 28, 2013

(30) Foreign Application Priority Data

Jul. 23, 2010 (JP) ................................ 2010-166506

(51) Int. Cl.
*H03H 9/58* (2006.01)
*G10K 9/125* (2006.01)
*H04R 17/00* (2006.01)

(52) U.S. Cl.
CPC ................ *G10K 9/125* (2013.01); *H04R 17/00* (2013.01); *H04R 2499/11* (2013.01)
USPC ........................................... 331/155; 310/349

(58) Field of Classification Search
USPC ............. 331/162, 46, 155; 310/349, 365, 366
See application file for complete search history.

(56) References Cited

U.S. PATENT DOCUMENTS

| | | | | |
|---|---|---|---|---|
| 4,384,174 | A | 5/1983 | Suzuki et al. | |
| 4,514,599 | A | 4/1985 | Yanagishima et al. | |
| 5,574,414 | A * | 11/1996 | Ogawa et al. | 333/189 |
| 7,550,904 | B2 * | 6/2009 | Kawakubo et al. | 310/365 |

FOREIGN PATENT DOCUMENTS

| | | | |
|---|---|---|---|
| JP | 56-053896 | U | 5/1981 |
| JP | 5653896 | U | 5/1981 |
| JP | 56-139199 | U | 10/1981 |
| JP | 56139199 | U | 10/1981 |

(Continued)

OTHER PUBLICATIONS

Communication dated Sep. 24, 2014 from the Japanese Patent Office in counterpart Japanese Patent Application No. 2012525305.

*Primary Examiner* — Joseph Chang
(74) *Attorney, Agent, or Firm* — Sughrue Mion, PLLC

(57) ABSTRACT

A second piezoelectric vibrator (30) is located in a hollow portion (21) of the first piezoelectric vibrator (20) when seen in a plan view. A support (40) is a frame-shaped member, and the inside surface thereof supports the edge of a vibration member (10). The fundamental resonance frequency of the first piezoelectric vibrator (20) is lower than the fundamental resonance frequency of the second piezoelectric vibrator (30). In addition, the second piezoelectric vibrator (30) overlaps a loop of vibration generated in the vibration member (10) when the first piezoelectric vibrator (20) is driven at the fundamental resonance frequency. Preferably, the center of the second piezoelectric vibrator (30) overlaps the center of a loop of vibration generated in the vibration member (10) by the first piezoelectric vibrator (20).

10 Claims, 13 Drawing Sheets

(56) References Cited

FOREIGN PATENT DOCUMENTS

| | | | |
|---|---|---|---|
| JP | 58-048186 | U | 3/1983 |
| JP | 5848186 | U | 3/1983 |
| JP | 63-314998 | A | 12/1988 |
| JP | 03-270282 | A | 12/1991 |
| JP | 05-122793 | A | 5/1993 |
| JP | 2003-513576 | A | 4/2003 |
| JP | 2009-518922 | A | 5/2009 |

* cited by examiner

OSCILLATOR

CROSS REFERENCE TO RELATED APPLICATIONS

This application is a National Stage of International Application No. PCT/JP2011/003893, filed on Jul. 7, 2011, and claims priority based on Japanese Patent Application No. 2010-166506, Jul. 23, 2010, the contents of all of which are incorporated herein by reference in their entirety.

TECHNICAL FIELD

The present invention relates to an oscillator making use of a piezoelectric vibrator.

BACKGROUND ART

In recent years, demand for portable terminals such as a cellular phone and a lap-top computer has grown. Particularly, thin portable terminals having sound function such as a video phone, a movie play, and a hands-free phone function as commodity values have being developed. In the development thereof, the requirement for a small-sized and high-output electro-acoustic transducer has increased. In electronic devices such as a cellular phone, an electro-dynamic electro-acoustic transducer has been used as an electro-acoustic transducer. The electro-dynamic electro-acoustic transducer is composed of a permanent magnet, a voice coil, and a vibrating membrane. However, the electro-dynamic electro-acoustic transducer has a limit to a reduction in thickness due to the operation principle and the structure thereof. Consequently, for example, as disclosed in Patent Documents 1 to 3, it is expected to use a piezoelectric vibrator as an electro-acoustic transducer. In particular, Patent Document 3 discloses a parametric speaker configured with the piezoelectric vibrator.

In addition, as disclosed in Patent Document 4, for example, there is a sound wave sensor as a use of the piezoelectric vibrator. The sound wave sensor is a sensor that detects the distance to an object or the like using a sound wave oscillated from the piezoelectric vibrator, or the like.

RELATED DOCUMENT

Patent Document

[Patent Document 1] Japanese Unexamined Patent Application Publication No. Hei 5-122793

[Patent Document 2] Japanese Unexamined Patent Application Publication (Translation of PCT Application) No. 2009-518922

[Patent Document 3] Japanese Unexamined Patent Application Publication (Translation of PCT Application) No. 2003-513576

[Patent Document 4] Japanese Unexamined Patent Application Publication No. Hei 3-270282

DISCLOSURE OF THE INVENTION

An oscillator making use of the piezoelectric vibrator generates a vibration amplitude based on an electro-striction action due to an input of an electrical signal, using a piezoelectric effect of a piezoelectric material. For this reason, there is an advantage over the above-mentioned electro-dynamic electro-acoustic transducer (oscillator) with respect to a reduction in thickness. However, since the piezoelectric material is a brittle material, and a mechanical loss is small, the mechanical quality factor Q is high with respect to the above-mentioned electro-dynamic electro-acoustic transducer. An oscillator making use of the piezoelectric vibrator takes a bending-type vibration mode, whereas the electro-dynamic electro-acoustic transducer generates a piston-type amplitude motion. For this reason, the oscillator making use of the piezoelectric vibrator has a tendency toward decreasing of the amount of variation in the vibration end and decreasing of the amount of volume exclusion in the same area, in comparison with the electro-dynamic electro-acoustic transducer. For this reason, in the oscillator making use of the piezoelectric vibrator, it is difficult to make a reduction in size while maintaining an output.

An object of the present invention is to provide an oscillator making use of a piezoelectric vibrator which is capable of making a reduction in size while maintaining an output.

According to the present invention, there is provided an oscillator including: a sheet-like vibration member; a first piezoelectric vibrator that is attached to one surface of the vibration member, has a hollow portion, and has a planar shape; a second piezoelectric vibrator that is attached to the one surface of the vibration member, and is located in the hollow portion of the first piezoelectric vibrator when seen in a plan view; and a support that supports an edge of the vibration member, wherein a fundamental resonance frequency of the first piezoelectric vibrator is lower than a fundamental resonance frequency of the second piezoelectric vibrator, and the second piezoelectric vibrator overlaps a loop of vibration generated in the vibration member when the first piezoelectric vibrator is driven at the fundamental resonance frequency.

According to the invention, in an oscillator making use of a piezoelectric vibrator, it is possible to make a reduction in size while maintaining an output.

BRIEF DESCRIPTION OF THE DRAWINGS

The above-mentioned objects, other objects, features and advantages will be made clearer from the preferred embodiments described below, and the following accompanying drawings.

DESCRIPTION OF EMBODIMENTS

Figure 1:
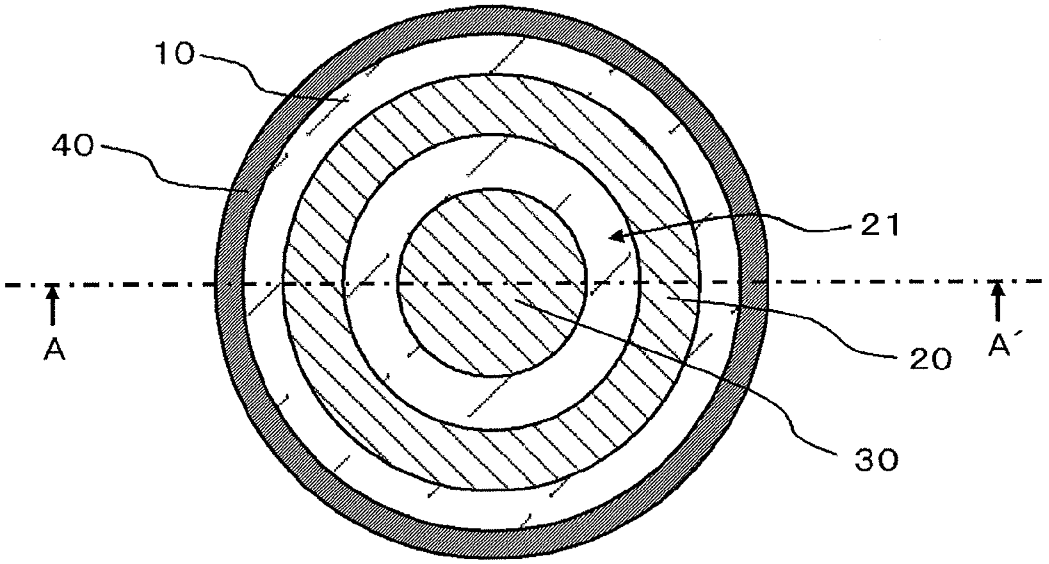
FIG. 1 is a plan view illustrating a configuration of an oscillator according to a first embodiment.

Hereinafter, the embodiments of the present invention will be described with reference to the accompanying drawings. In all the drawings, like elements are referenced by like reference numerals and descriptions thereof will not be repeated.

First Embodiment

Figure 2:
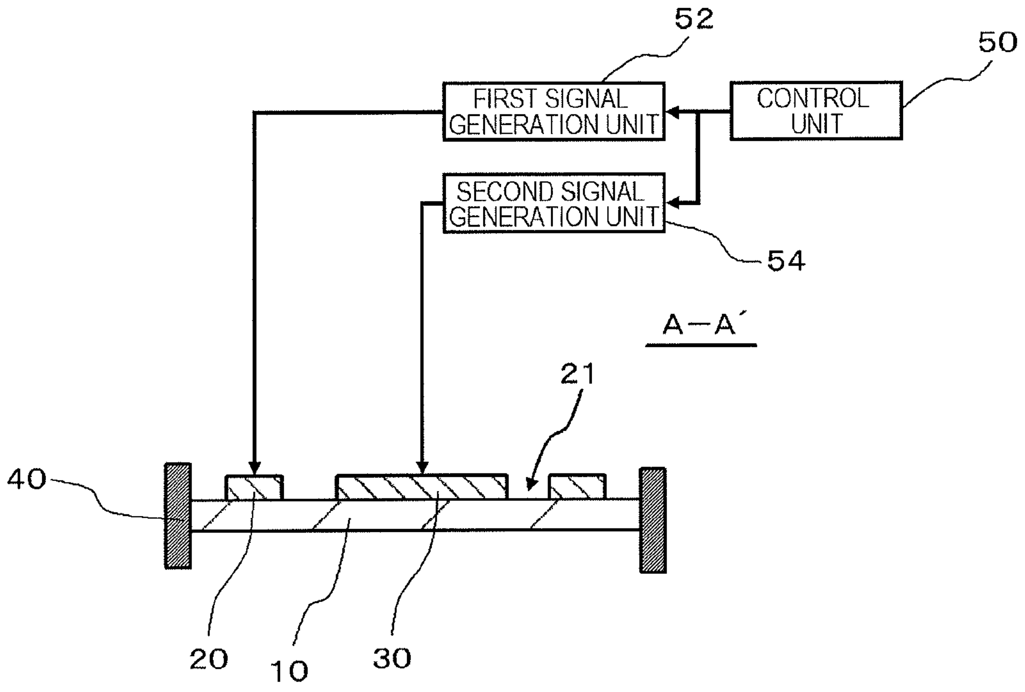
FIG. 2 is a diagram illustrating a cross-sectional view taken along the line A-A' of FIG. 1 including peripheral circuits.

FIG. 1 is a plan view illustrating a configuration of an oscillator according to a first embodiment. FIG. 2 is a diagram illustrating a cross-sectional view taken along the line A-A' of FIG. 1 including peripheral circuits. The oscillator includes a vibration member 10, a first piezoelectric vibrator 20, a second piezoelectric vibrator 30, and a support 40. The vibration member 10 is formed in a sheet shape. The first piezoelectric vibrator 20 is attached to one surface of the vibration member 10, and has a hollow portion 21 with a planar shape. The second piezoelectric vibrator 30 is attached to the above-mentioned one surface of the vibration member 10, and is located in the hollow portion 21 of the first piezoelectric vibrator 20 when seen in a plan view. The support 40 is a frame-shaped member, and the inside surface thereof supports the edge of the vibration member 10. The fundamental resonance frequency of the first piezoelectric vibrator 20 is lower than the fundamental resonance frequency of the second piezoelectric vibrator 30. In addition, the second piezoelectric vibrator 30 overlaps a loop of vibration, for example, the center of a loop of vibration, generated in the vibration member 10 when the first piezoelectric vibrator 20 is driven at the fundamental resonance frequency. Preferably, the center of the second piezoelectric vibrator 30 overlaps the center of a loop of vibration generated in the vibration member 10 by the first piezoelectric vibrator 20. The oscillator is used as, for example, a speaker, or an oscillation source of a sound wave sensor. In addition, the second piezoelectric vibrator 30 which is relatively small can also function as a temperature sensor by using a pyroelectric effect of a piezoelectric substance. When the oscillator is used as a speaker, the oscillator is used as, for example, a sound source of an electronic device (for example, a cellular phone, a laptop personal computer, a small-sized game machine or the like). Hereinafter, a detailed description will be made.

The vibration member 10 is vibrated by vibrations generated from the first piezoelectric vibrator 20 and the second piezoelectric vibrator 30. In addition, the vibration member 10 adjusts the fundamental resonance frequencies of the first piezoelectric vibrator 20 and the second piezoelectric vibrator 30. The fundamental resonance frequency of a mechanical vibrator depends on load weight and compliance. Since the compliance is a mechanical rigidity of a vibrator, the fundamental resonance frequencies of the first piezoelectric vibrator 20 and the second piezoelectric vibrator 30 can be controlled by controlling the rigidity of the vibration member 10. Meanwhile, the thickness of the vibration member 10 is preferably equal to or more than 5 μm, and equal to or less than 500 μm. In addition, in the vibration member 10, the modulus of longitudinal elasticity which is an index indicating rigidity is preferably equal to or more than 1 Gpa, and equal to or less than 500 GPa. When the rigidity of the vibration member 10 is excessively low or excessively high, it is possible that the characteristics and reliability of a mechanical vibrator are damaged. Meanwhile, the material constituting the vibration member 10 is not particularly limited as long as it is a material, such as metal or resin, having a high elastic modulus with respect to the first piezoelectric vibrator 20 and the second piezoelectric vibrator 30 which are brittle materials, but is preferably phosphor bronze, stainless steel or the like from the viewpoint of workability and costs.

In the embodiment, the first piezoelectric vibrator 20 is ring-shaped, and both of the outer circumference and the inner circumference thereof are circular. The second piezoelectric vibrator 30 is circular. The second piezoelectric vibrator 30 is smaller in size than the first piezoelectric vibrator 20. For this reason, the fundamental resonance frequency of the second piezoelectric vibrator 30 is higher than the fundamental resonance frequency of the first piezoelectric vibrator 20. In addition, the first piezoelectric vibrator 20 and the second piezoelectric vibrator 30 are configured such that the entirety of the surface of the first piezoelectric vibrator 20 and the second piezoelectric vibrator 30 facing the vibration member 10 is fixed to the vibration member 10 by an adhesive.

In addition, the oscillator includes a control unit 50, a first signal generation unit 52, and a second signal generation unit 54, as an oscillation circuit. The first signal generation unit 52 generates an electrical signal which is input to the first piezoelectric vibrator 20. The second signal generation unit 54 generates an electrical signal which is input to the second piezoelectric vibrator 30. The control unit 50 controls the first signal generation unit 52 and the second signal generation unit 54 on the basis of information which is input from the outside. When the oscillator is used as a speaker, the information which is input to the control unit 50 is an audio signal. In addition, when the oscillator is used as a sound wave sensor, the signal which is input to the control unit 50 is a command signal to transmit a sound wave. When the oscillator is uses as a sound wave sensor, the first signal generation unit 52 makes the first piezoelectric vibrator 20 generate a sound wave of the resonance frequency of the first piezoelectric vibrator 20, and the second signal generation unit 54 makes the second piezoelectric vibrator 30 generate a sound wave of the resonance frequency of the second piezoelectric vibrator 30.

Figure 3:
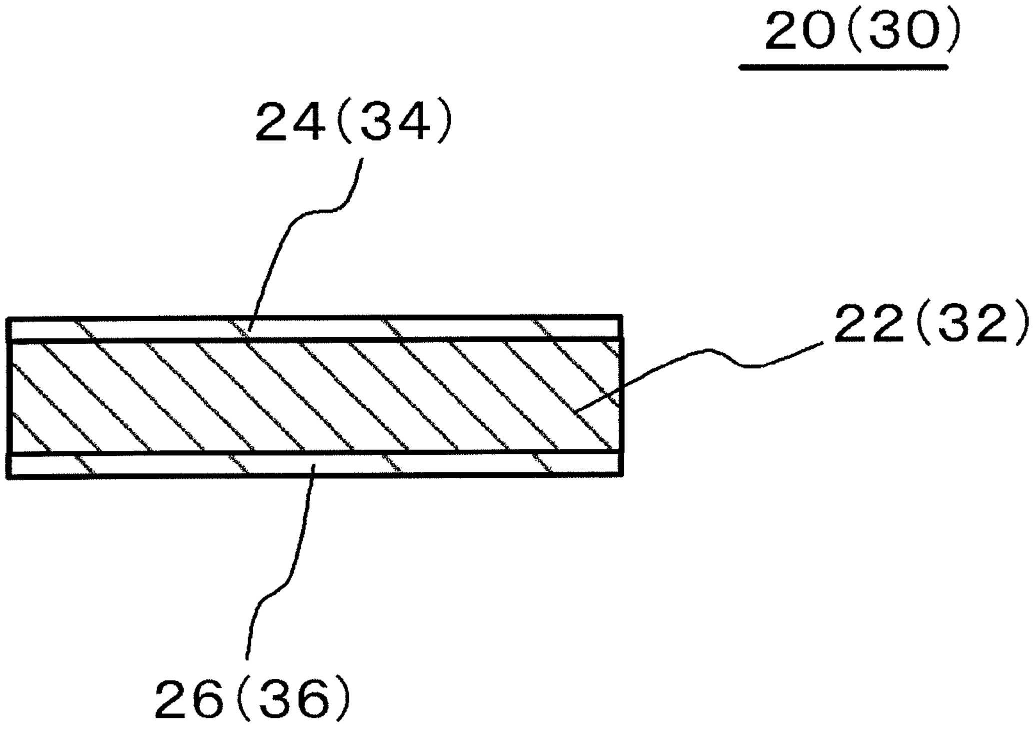
FIG. 3 is a cross-sectional view illustrating configurations of a first piezoelectric vibrator and a second piezoelectric vibrator in the thickness direction.

FIG. 3 is a cross-sectional view illustrating a configuration of the first piezoelectric vibrator 20 and the second piezoelectric vibrator 30 in the thickness direction. The first piezoelectric vibrator 20 includes a piezoelectric substance 22, an upper electrode 24, and a lower electrode 26. In addition, the second piezoelectric vibrator 30 includes a piezoelectric substance 32, an upper electrode 34, and a lower electrode 36. Meanwhile, the general structures of the first piezoelectric vibrator 20 and the second piezoelectric vibrator 30 are the same as each other, and thus only the structure of the first piezoelectric vibrator 20 will be described below.

The piezoelectric substance 22 is polarized in the thickness direction. The material constituting the piezoelectric substance 22 may be either of an inorganic material or an organic material as long as it is a material having a piezoelectric effect. However, the material is preferably a material having a high electro-mechanical conversion efficiency, for example, piezoelectric zirconate titanate (PZT) or barium titanate ($BaTiO_3$). The thickness h of the piezoelectric substance 22 is, for example, equal to or more than 10 μm, and equal to or less than 1 mm. When the thickness $h_1$ is less than 10 μm, it is possible that the first piezoelectric vibrator 20 and the second piezoelectric vibrator 30 are damaged during the manufacturing of the oscillator. In addition, when the thickness $h_1$, exceeds 1 mm, the electro-mechanical conversion efficiency is excessively lowered, and thus a sufficiently large vibration cannot be obtained. It is because when the thicknesses of the first piezoelectric vibrator 20 and the second piezoelectric vibrator 30 increase, the electric field intensity within the piezoelectric vibrator is inversely proportional thereto and thus decreases. In addition, the thicknesses of the piezoelectric substances 22 and 32 may be the same as each other, and may be different from each other.

Although the materials constituting the upper electrode 24 and the lower electrode 26 are not particularly limited, and for example, silver or silver/palladium can be used. Since silver is used as a low-resistance and versatile electrode material, there is an advantage in a manufacturing process, cost, and the like. Since silver/palladium is a low-resistance material excellent in oxidation resistance, there is an advantage from the viewpoint of reliability. In addition, the thickness $h_2$ of the upper electrode 24 and the lower electrode 26 is not particularly limited, but the thickness $h_2$ is preferably equal to or more than 1 μm, and equal to or less than 100 μm. When the thickness $h_2$ is less than 1 μm, it is difficult to uniformly form the upper electrode 24 and the lower electrode 26. As a result, it is possible that the electro-mechanical conversion efficiency decreases. In addition, when the film thicknesses of the upper electrode 24 and the lower electrode 26 exceed 100 μm, the upper electrode 24 and the lower electrode 26 serve as constraint surfaces with respect to the piezoelectric substance 22, and it is possible that the energy conversion efficiency are decreased.

Next, a method of manufacturing the oscillator will be described. First of all, the first piezoelectric vibrator 20 and the second piezoelectric vibrator 30 are processed into predetermined planar shapes. In addition, the vibration member 10 is processed into a predetermined shape. At this time, a polarization process is already performed on the piezoelectric substances 22 and 32. Next, the first piezoelectric vibrator 20 and the second piezoelectric vibrator 30 are fixed to the vibration member 10 using an adhesive such as an epoxy resin. Meanwhile, the vibration member 10 may be fixed to the support 40 at a timing before or after the first piezoelectric vibrator 20 and the second piezoelectric vibrator 30 are fixed to the vibration member 10. The support 40 is formed of, for example, a metal such as stainless steel.

Here, the first piezoelectric vibrator 20 can be set to have an outer diameter of ϕ18 mm, an inner diameter of ϕ12 mm, and a thickness of 100 μm. In addition, the second piezoelectric vibrator 30 can be set to have an outer diameter of ϕ3 mm and a thickness of 100 μm (0.1 mm). In addition, for example, a silver/palladium alloy (having a weight ratio of, for example, 7:3) having a thickness of 8 μm can be used as the upper electrodes 24 and 36 and the lower electrodes 26 and 36. In addition, as the vibration member 10, phosphor bronze having an outer diameter of ϕ20 mm and a thickness of 50 μm (0.05 mm) can be used. The support 40 is, for example, a hollow case having an outer diameter of ϕ22 mm and an inner diameter of ϕ20 mm.

Next, a case where the oscillator is used as a speaker will be described. As mentioned above, the fundamental resonance frequency of the first piezoelectric vibrator 20 is lower than the fundamental resonance frequency of the second piezoelectric vibrator 30. For this reason, it is preferable to mainly oscillate a sound having a relatively low frequency from the first piezoelectric vibrator 20, and to mainly oscillate a sound having a relatively high frequency from the second piezoelectric vibrator 30.

In addition, multiple sets of the vibration members 10, the first piezoelectric vibrators 20, and the second piezoelectric vibrators 30 may be provided. In this case, the oscillator can be used as a parametric speaker. In this case, the control unit 50 can input a signal indicating a reproduced sound, as it is, to the first piezoelectric vibrator 20 through the first signal generation unit 52, and can input a modulation signal of a parametric speaker to the small-sized second piezoelectric vibrator 30 through the second signal generation unit 54. When the oscillator is used as a parametric speaker, in the second piezoelectric vibrator 30, a sound wave of equal to or more than 20 kHz, for example, 100 kHz is used as a signal transportation wave. In addition, when the first piezoelectric vibrator 20 is used as a normal speaker, the fundamental resonance frequency of the first piezoelectric vibrator 20 is set to, for example, equal to or less than 1 kHz.

Meanwhile, generally, the piezoelectric vibrator has a high mechanical quality factor Q. For this reason, since energy is concentrated in the vicinity of the fundamental resonance frequency, the intensity of the sound wave is high in the vicinity of the resonance frequency, but the sound wave is considerably attenuated in other bands. On the other hand, the parametric speaker may oscillate at a single frequency. For this reason, it is preferable to use the second piezoelectric vibrator 30 as a parametric speaker from the viewpoint of the improvement in the efficiency of the speaker.

Here, the principle of the parametric speaker will be described. The parametric speaker emits ultrasonic waves on which an AM modulation, a DSB modulation, an SSB modulation, or an FM modulation is performed from each of a plurality of oscillation sources into the air, and issues an audible sound based on the non-linear characteristics when ultrasonic waves are propagated into the air. The term "non-linear" herein indicates that a transition from a laminar flow to a turbulent flow occurs when the Reynolds number expressed with the ratio of the inertial action and the viscous action of a flow increases. Since the sound wave is very slightly disturbed within a fluid, the sound wave is propagated non-linearly. Particularly, in the ultrasonic wave frequency band, the non-linearity of the sound wave can be easily observed. When the ultrasonic waves are emitted into the air, higher harmonic waves associated with the non-linearity of the sound wave are conspicuously generated. In addition, the sound wave is a sparse and dense wave in which the molecular density is caused to be sparse and dense in the air. When it takes time for air molecules to be restored rather than compressed, the air which is not capable of being restored after the compression collides with air molecules continuously propagated, and thus a shockwave occurs. The audible sound is generated by this shock wave.

Next, the operations and effects of the embodiment will be described. In the embodiment, the second piezoelectric vibrator 30 overlaps a loop of vibration generated in the vibration member 10 when the first piezoelectric vibrator 20 vibrates at the fundamental resonance frequency. For this reason, when the first piezoelectric vibrator 20 vibrates in the vicinity of the fundamental resonance frequency, the second piezoelectric vibrator 30 greatly vibrates. In addition, the fundamental resonance frequency of the first piezoelectric vibrator 20 is lower than the fundamental resonance frequency of the second piezoelectric vibrator 30. For this reason, when the first piezoelectric vibrator 20 vibrates in the vicinity of the fundamental resonance frequency, resonance does not occur in the second piezoelectric vibrator 30, and thus can be considered as a plate.

Therefore, when the first piezoelectric vibrator 20 vibrates in the vicinity of the fundamental resonance frequency, the second piezoelectric vibrator 30 greatly vibrates, so that it is possible to make a reduction in size while maintaining an output.

In addition, since the fundamental resonance frequencies of the first piezoelectric vibrator 20 and the second piezoelectric vibrator 30 are different from each other, sound waves having frequencies different from each other can be efficiently generated from the first piezoelectric vibrator 20 and the second piezoelectric vibrator 30. In addition, when the oscillator is used as a speaker, the sound waves are caused to interfere with each other by simultaneously driving the first piezoelectric vibrator 20 and the second piezoelectric vibrator 30, and thus the sound pressure level can be increased. In addition, when the second piezoelectric vibrator 30 is caused to function as a parametric speaker, it is possible to reproduce a sound with high directivity.

Particularly, when the first piezoelectric vibrator 20 is used as a normal speaker, and the second piezoelectric vibrator 30 is used as a parametric speaker, different sounds are reproduced in the first piezoelectric vibrator 20 and the second piezoelectric vibrator 30, so that it is possible to cause only a person who is in a specific place to hear a sound reproduced by the second piezoelectric vibrator 30, and to cause persons who are in other places to only hear a sound reproduced by the first piezoelectric vibrator 20. This effect can be obtained even when speakers other than the first piezoelectric vibrator 20 are used as a normal speaker.

Second Embodiment

Figure 4:
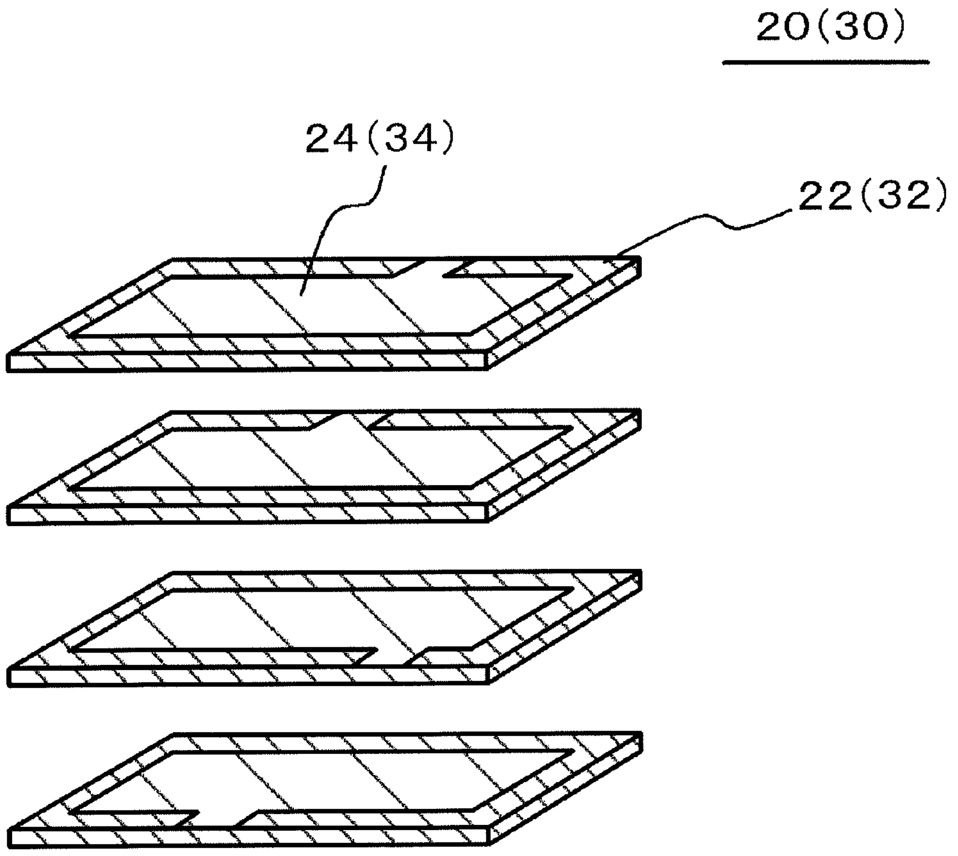
FIG. 4 is an exploded perspective view illustrating a configuration of the first piezoelectric vibrator of an oscillator according to a second embodiment.

FIG. 4 is an exploded perspective view illustrating a configuration of the first piezoelectric vibrator 20 of an oscillator according to a second embodiment. An oscillator according to the embodiment has the same configuration as that of the oscillator according to the first embodiment, except that the first piezoelectric vibrator 20 has a structure in which a plurality of piezoelectric substances 22 and electrodes 24 are alternately laminated, and that the second piezoelectric vibrator 30 has also the same structure. The polarization directions of the piezoelectric substance 22 switch each other for each layer, and alternate with each other.

In the embodiment, the same effect as that of the first embodiment can also be obtained. In addition, since the first piezoelectric vibrator 20 and the second piezoelectric vibrator 30 have a structure in which a plurality of piezoelectric substances 22 and 32 and electrodes 24 and 34 are alternately laminated, the amount of expansion and contraction of the first piezoelectric vibrator 20 and the second piezoelectric vibrator 30 increases. Therefore, it is possible to increase an output of the oscillator.

Third Embodiment

Figure 5:
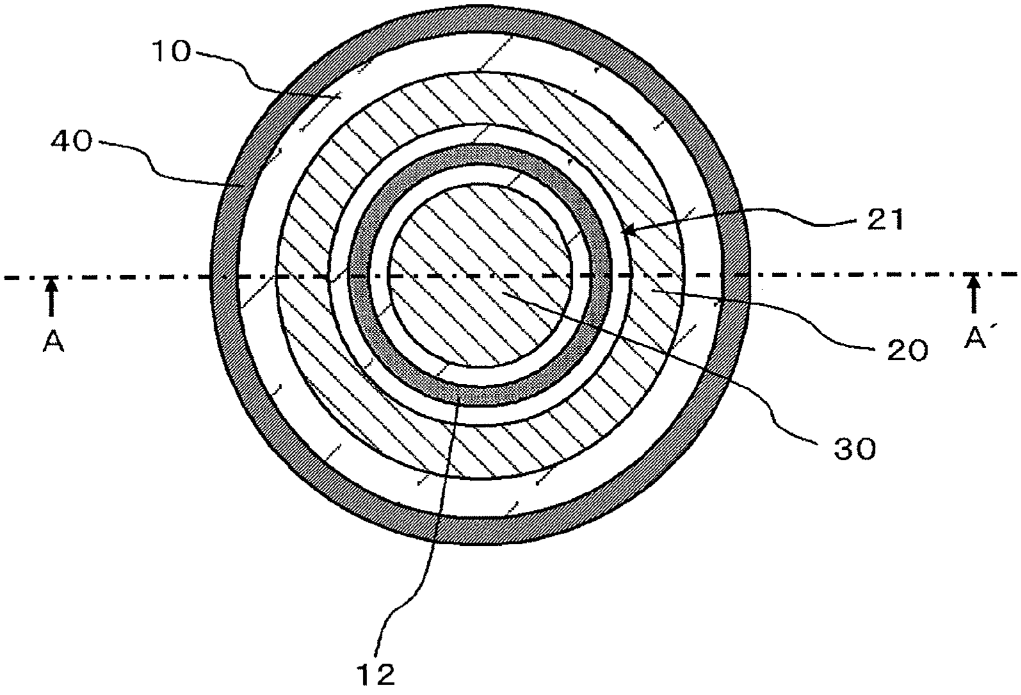
FIG. 5 is a plan view illustrating an oscillator according to a third embodiment.
Figure 6:
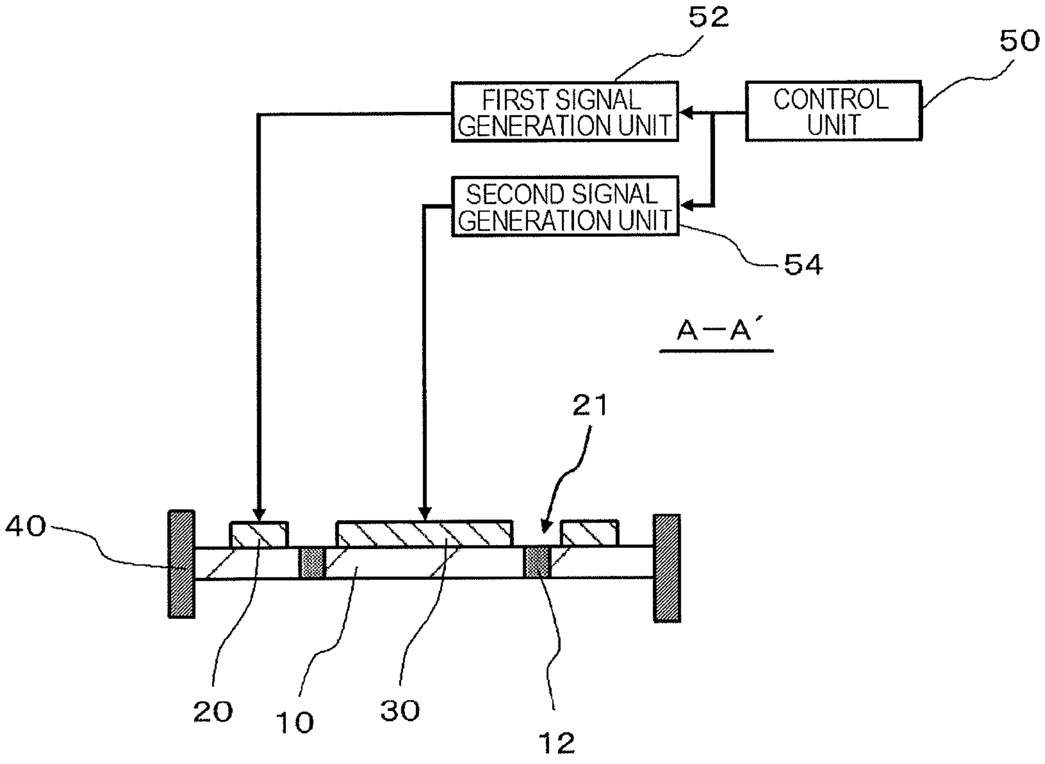
FIG. 6 is a cross-sectional view taken along the line A-A' of FIG. 5.

FIG. 5 is a plan view illustrating an oscillator according to a third embodiment, and FIG. 6 is a cross-sectional view taken along the line A-A' of FIG. 5. The oscillator according to the embodiment has the same configuration as that of the oscillator according to the first embodiment, except that a first shield member 12 is included therein.

The first shield member 12 is buried in the vibration member 10, and is located in the hollow portion 21 of the first piezoelectric vibrator 20 when seen in a plan view. The first shield member 12 surrounds the second piezoelectric vibrator 30, and is formed of a material having a lower modulus of longitudinal elasticity than that of the vibration member 10, for example, a resin. In the example shown in the drawing, the first shield member 12 is provided in the entirety of the vibration member 10 when seen in the thickness direction, but the first shield member 12 may be provided on a portion thereof, for example, only the surface side or only the back side thereof.

In the embodiment, the same effect as that of the first embodiment can also be obtained. In addition, the first shield member 12 is provided, and thus when the first piezoelectric vibrator 20 vibrates, it is possible to suppress the propagation of the vibration to the second piezoelectric vibrator 30. In addition, by locating the first shield member 12 at a node of the vibration when the second piezoelectric vibrator 30 vibrates at the fundamental vibration frequency, it is possible to reduce the rigidity of the node, and to form a free end in the vibration. In this case, since the movable range of the vibrating member is expanded, it is possible to increase an output of the vibration of the second piezoelectric vibrator 30. In addition, since the first shield member 12 is interposed, it is possible to suppress the propagation of a shock to the second piezoelectric vibrator 30 when the oscillator falls. For this reason, the reliability of the oscillator is improved.

Fourth Embodiment

Figure 7:
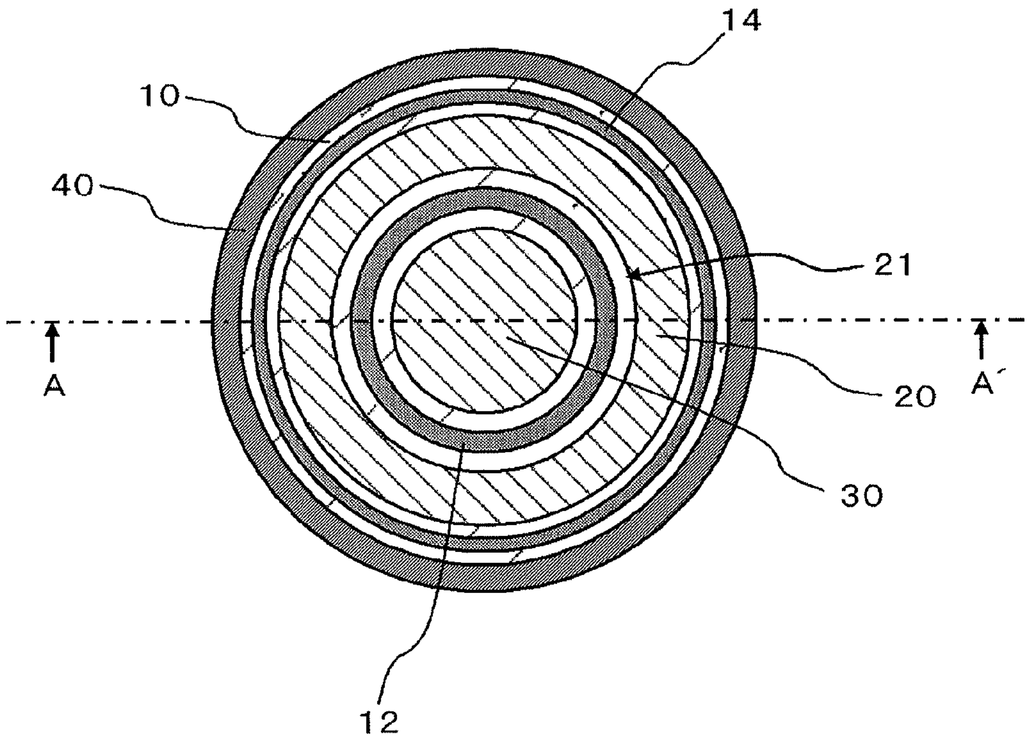
FIG. 7 is a plan view illustrating an oscillator according to a fourth embodiment.
Figure 8:
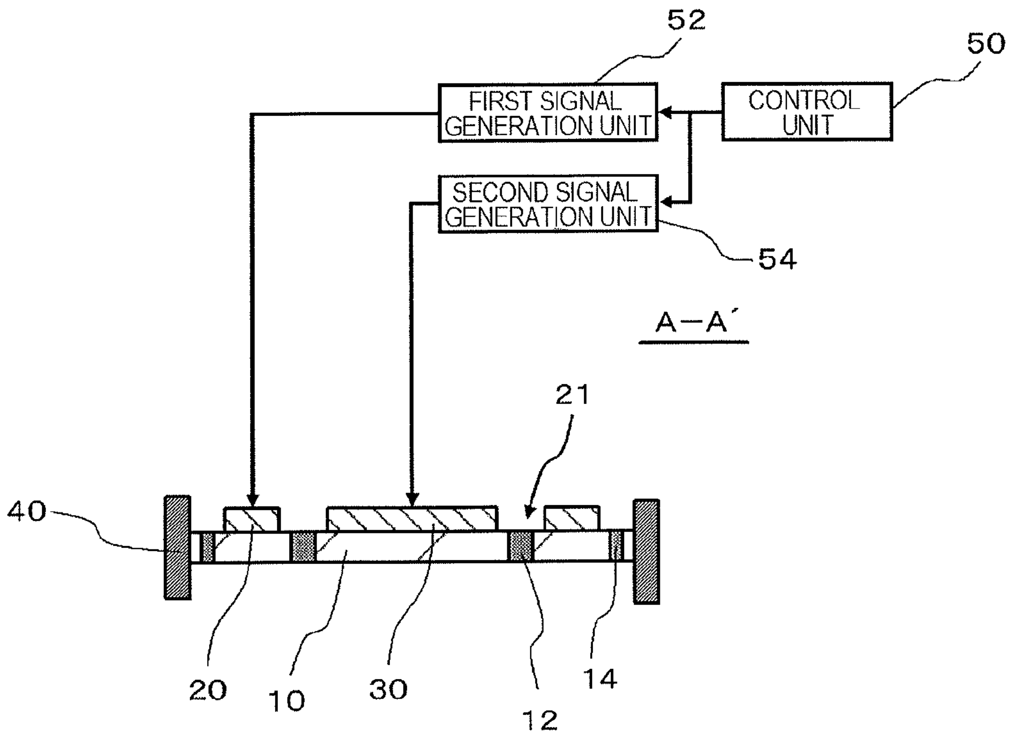
FIG. 8 is a cross-sectional view taken along the line A-A' of FIG. 7.

FIG. 7 is a plan view illustrating an oscillator according to a fourth embodiment, and FIG. 8 is a cross-sectional view taken along the line A-A' of FIG. 7. The oscillator according to the embodiment has the same configuration as that of the oscillator according to the third embodiment, except that a second shield member 14 is included therein.

The second shield member 14 is buried in the vibration member 10, and surrounds the first piezoelectric vibrator 20 when seen in a plan view. The second shield member 14 is formed of a material having a modulus of longitudinal elasticity lower than that of the vibration member 10, for example, a resin. The material of the second shield member 14 may be the same as the material of the first shield member 12, and may be different therefrom. In addition, in the example shown in the drawing, the second shield member 14 is provided in the entirety of the vibration member 10 when seen in the thickness direction, but the second shield member 14 may be provided on a portion thereof, for example, only the surface side or only the back side thereof.

In the embodiment, the same effect as that of the third embodiment can also be obtained. In addition, by locating the second shield member 14 at a node of the vibration when the first piezoelectric vibrator 20 vibrates at the fundamental vibration frequency, it is possible to reduce the rigidity of the node, and to form a free end in the vibration. In this case, since the movable range of the vibrating member is expanded, it is possible to increase an output of the vibration of the first piezoelectric vibrator 20. In addition, since the second shield member 14 is interposed, it is possible to suppress the propagation of a shock to the first piezoelectric vibrator 20 and the second piezoelectric vibrator 30 when the oscillator falls. For this reason, the reliability of the oscillator is improved.

Fifth Embodiment

Figure 9:
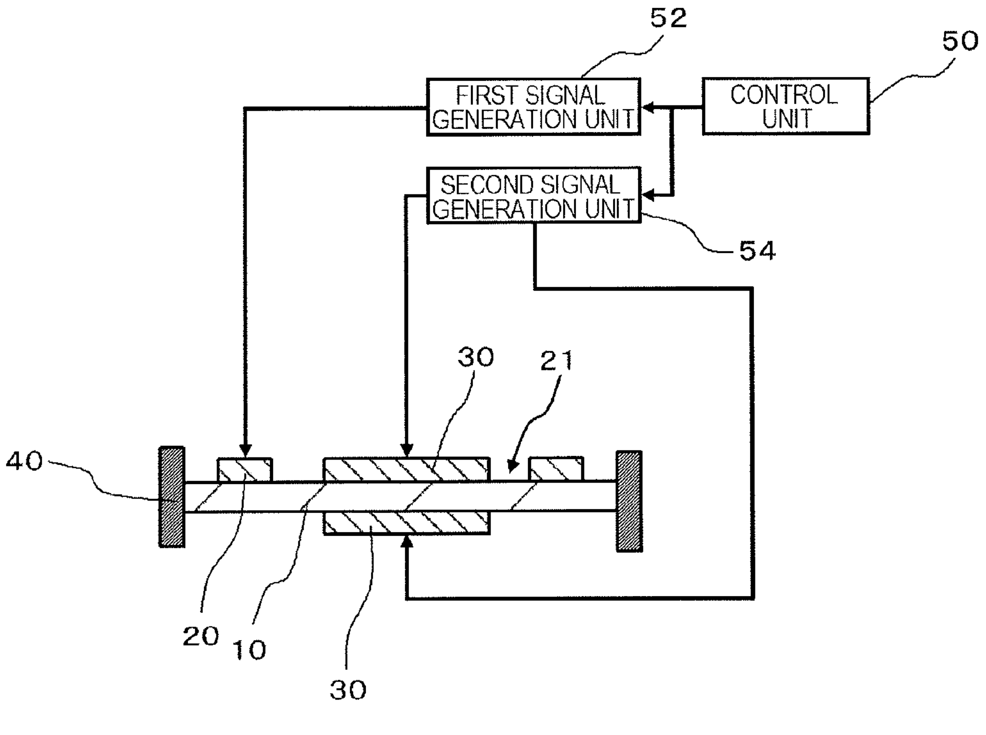
FIG. 9 is a cross-sectional view illustrating an oscillator according to a fifth embodiment.

FIG. 9 is a cross-sectional view illustrating an oscillator according to a fifth embodiment. This oscillator has the same configuration as that of the oscillator according to the first embodiment, except that both sides of the vibration member 10 are provided with the second piezoelectric vibrators 30. That is, in the embodiment, the piezoelectric vibrator of the oscillator has a bimorph structure in which both sides of the vibration member 10 are constrained by the piezoelectric vibrator. The two second piezoelectric vibrators 30 may be the same as each other in shape, and may be different from each other in shape.

Figure 10:
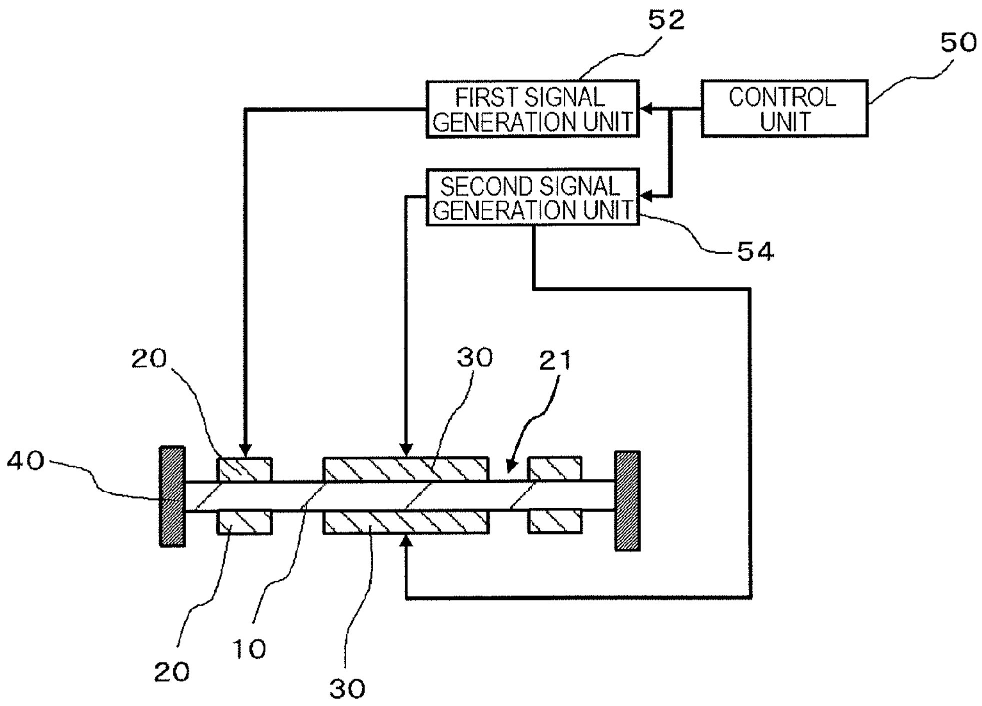
FIG. 10 is a cross-sectional view illustrating a modified example of FIG. 9.

Meanwhile, in the embodiment, as shown in FIG. 10, the first piezoelectric vibrator 20 may also be provided on both sides of the vibration member 10.

In the embodiment, the same effect as that of the first embodiment can be obtained. In addition, since the piezoelectric vibrator has a bimorph structure, it is possible to obtain a larger vibration.

Sixth Embodiment

Figure 11:
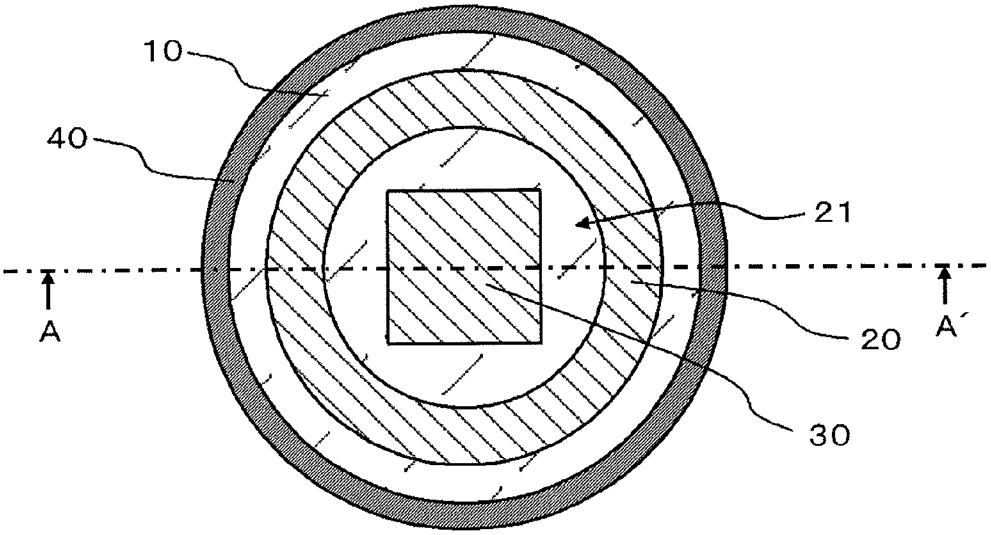
FIG. 11 is a plan view illustrating an oscillator according to a sixth embodiment.

FIG. 11 is a plan view illustrating an oscillator according to a sixth embodiment. This oscillator has the same configuration as that of the oscillator according to the first embodiment, except that the planar shape of the second piezoelectric vibrator 30 is rectangular, for example, square.

In the embodiment, the same effect as that of the first embodiment can be obtained. Meanwhile, the planar shape of the second piezoelectric vibrator 30 is not limited to the shapes shown in the first embodiment and the embodiment. In addition, the planar shape of the first piezoelectric vibrator 20 is not limited to that of each of the above-mentioned embodiments.

Seventh Embodiment

Figure 12:
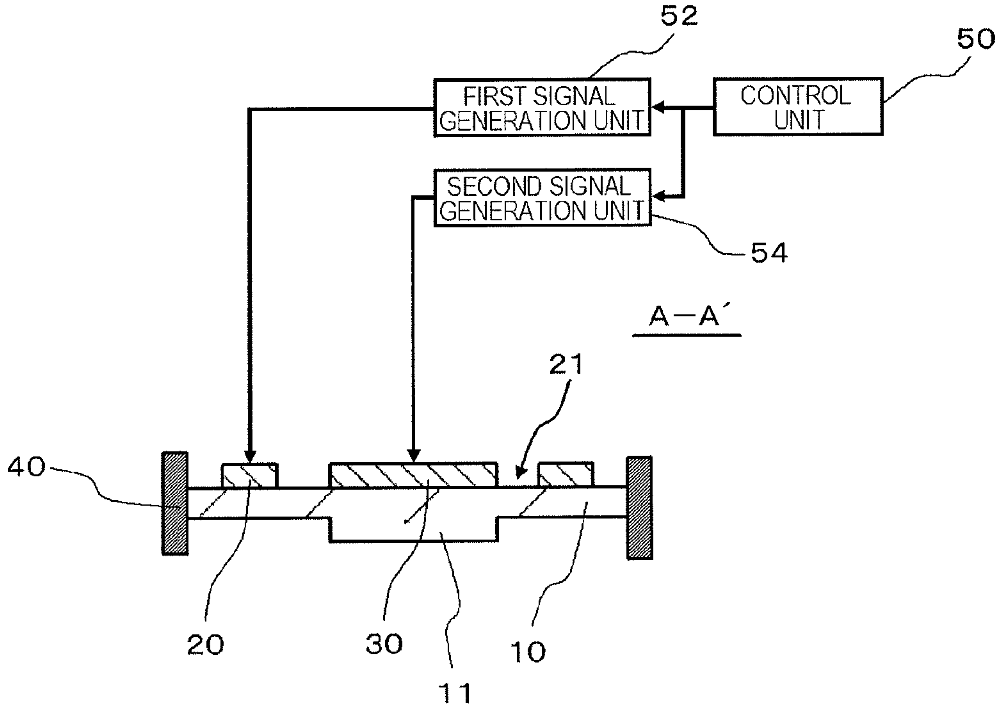
FIG. 12 is a cross-sectional view illustrating an oscillator according to a seventh embodiment.

FIG. 12 is a cross-sectional view illustrating an oscillator according to a seventh embodiment. This oscillator has the same configuration as that of the oscillator according to the first embodiment, except that the thickness of the vibration member 10 is partially changed. In the embodiment, the vibration member 10 includes a convex portion 11 in the portion overlapping the second piezoelectric vibrator 30 and being in the surface on the opposite side to the second piezoelectric vibrator 30.

In the embodiment, the same effect as that of the first embodiment can be obtained. In addition, it is possible to adjust the oscillation characteristics of an oscillation device by partially changing the thickness of the vibration member 10.

Example

The oscillators shown in FIGS. 1, 4, 5, 7, 9, 10, 11, and 12 were created, and the characteristics of each oscillator were examined (Examples 1 to 8). In the example, the oscillators were caused to function as a parametric speaker. In addition, as a comparative example, an electro-dynamic oscillator having the same plane area as that in Examples 1 to 8 was created, and the characteristics thereof were examined. The results are shown in Table 1.

TABLE 1

| | | Example 1 | Example 2 | Example 3 | Example 4 | Example 5 | Example 6 | Example 7 | Example 8 | Comparative Example |
|---|---|---|---|---|---|---|---|---|---|---|
| Sound | 1 kHz | 91 | 88 | 87 | 87 | 87 | 88 | 88 | 93 | 77 |
| Pressure | 3 kHz | 88 | 90 | 86 | 86 | 85 | 88 | 92 | 91 | 75 |
| Level | 5 kHz | 90 | 87 | 90 | 87 | 86 | 87 | 91 | 90 | 76 |
| (dB) | 10 kHz | 88 | 86 | 88 | 84 | 85 | 86 | 87 | 88 | 97 |
| Flatness Of Frequency Characteristics | | Good | Good | Good | Good | Good | Good | Good | Good | Bad |
| Falling Shock Stability | | Good | Good | Good | Good | Good | Good | Good | Good | Bad |

From the table, the oscillator according to each example showed that the output was higher than that of the comparative example, the frequency characteristics were flatter than that of the comparative example, and the resistance to a shock of falling was stronger than that of the comparative example.

Figure 13:
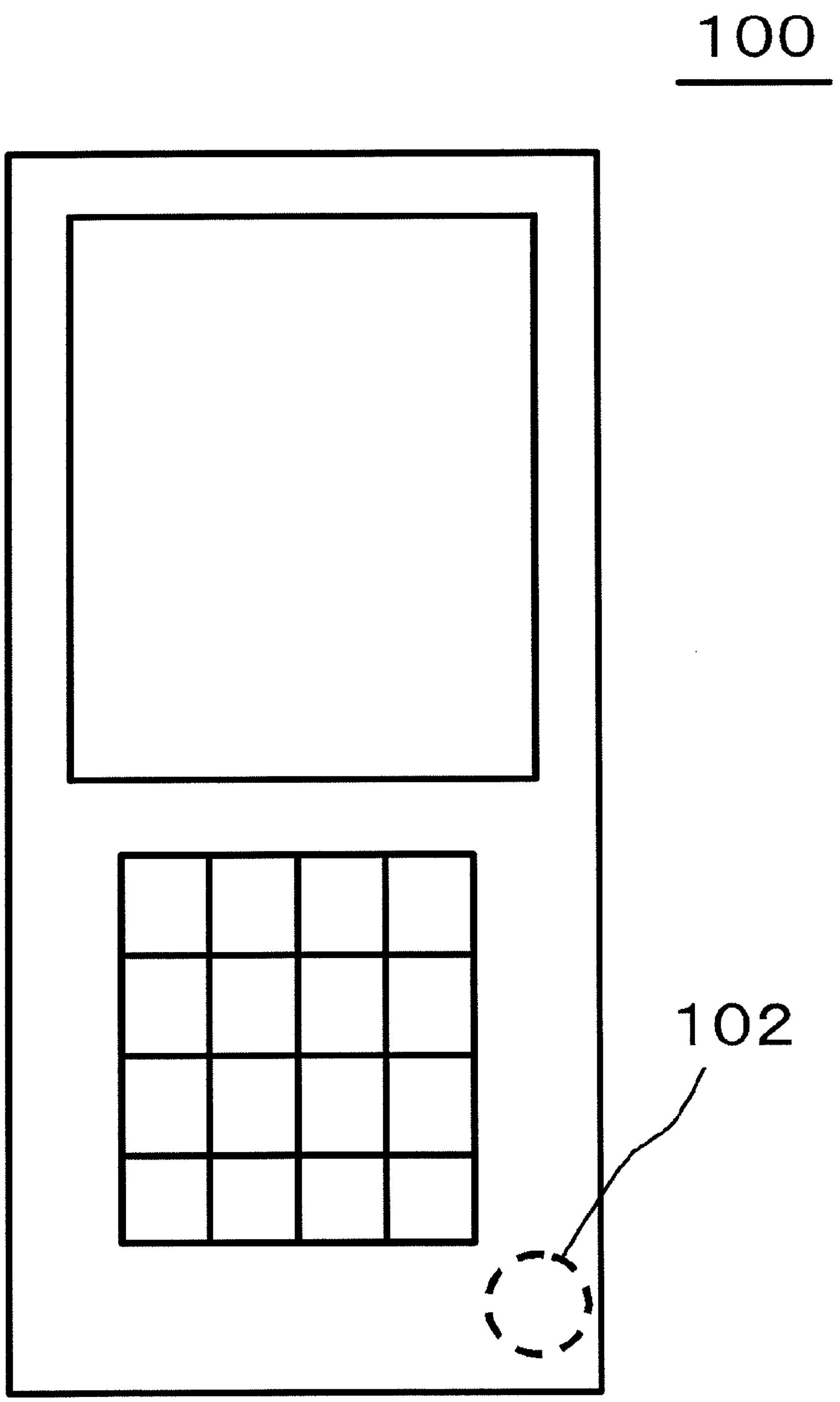
FIG. 13 is a schematic diagram illustrating a configuration of a portable communication terminal.

In addition, as shown in FIG. 13, as a speaker 102 of a portable communication terminal 100, the oscillators of Examples 1 to 8 were used. The speaker 102 was attached to the inner surface of a housing of the portable communication terminal 100. The characteristics of the speaker 102 when each example is used are shown in Table 2.

TABLE 2

| | | Example 1 | Example 2 | Example 3 | Example 4 | Example 5 | Example 6 | Example 7 | Example 8 |
|---|---|---|---|---|---|---|---|---|---|
| Sound | 1 kHz | 86 | 87 | 86 | 88 | 89 | 89 | 86 | 88 |
| Pressure | 3 kHz | 87 | 90 | 85 | 91 | 90 | 92 | 86 | 88 |
| Level | 5 kHz | 88 | 88 | 88 | 90 | 92 | 94 | 85 | 87 |
| (dB) | 10 kHz | 87 | 89 | 90 | 87 | 89 | 89 | 89 | 89 |
| Falling Shock Stability | | Good | Good | Good | Good | Good | Good | Good | Good |

From the table, the speaker 102 according to each example showed that the frequency characteristics were flat, and the speaker was resistant to a shock of falling.

As described above, although the embodiments of the invention have been set forth with reference to the drawings, these are merely illustrative of the invention, and various configurations other than those stated above can be adopted.

The application claims priority to Japanese Patent Application No. 2010-166506 filed on Jul. 23, 2010, the content of which is incorporated herein by reference in its entirety.

The invention claimed is:

1. An oscillator comprising:

a sheet-like vibration member;

a first piezoelectric vibrator that is attached to one surface of the vibration member, has a hollow portion, and has a planar shape;

a second piezoelectric vibrator that is attached to the one surface of the vibration member, is located in the hollow portion of the first piezoelectric vibrator when seen in a plan view, and is spatially separated from the first piezoelectric vibrator; and a support that supports an edge of the vibration member, wherein a fundamental resonance frequency of the first piezoelectric vibrator is lower than a fundamental resonance frequency of the second piezoelectric vibrator, and the second piezoelectric vibrator overlaps a loop of vibration generated in the vibration member when the first piezoelectric vibrator is driven at the fundamental resonance frequency.

2. The oscillator according to claim 1, further comprising a first shield member that is buried in the vibration member, is located in the hollow portion of the first piezoelectric vibrator when seen in a plan view, surrounds the second piezoelectric vibrator, and is formed of a material having a modulus of longitudinal elasticity lower than that of the vibration member.

3. The oscillator according to claim 2, wherein the first shield member is formed of a resin.

4. The oscillator according to claim 1, further comprising a second shield member which is buried in the vibration member, is located between the first piezoelectric vibrator and the support when seen in a plan view, surrounds the first piezoelectric vibrator, and is formed of a material having a modulus of longitudinal elasticity lower than that of the vibration member.

5. The oscillator according to claim 4, wherein the second shield member is formed of a resin.

6. The oscillator according to claim 1, wherein the first piezoelectric vibrator is ring-shaped.

7. The oscillator according to claim 6, wherein the second piezoelectric vibrator is circular.

8. The oscillator according to claim 1, wherein the oscillator is an oscillation source of a sound wave sensor.

9. The oscillator according to claim 8, further comprising a control unit that generates a sound wave having a first frequency in the first piezoelectric vibrator, and generates a sound wave having a second frequency higher than the first frequency in the second piezoelectric vibrator.

10. The oscillator according to claim 1, wherein the oscillator is a speaker, the multiple sets of the vibration member, the first piezoelectric vibrator, and the second piezoelectric vibrator are provided, and the oscillator further includes a control unit that inputs a signal indicating a reproduced sound, as it is, to the first piezoelectric vibrator, and inputs a modulation signal of a parametric speaker to the second piezoelectric vibrator.

* * * * *